United States Patent
Naaman et al.

(10) Patent No.: US 9,467,126 B1
(45) Date of Patent: Oct. 11, 2016

(54) JOSEPHSON CURRENT SOURCE SYSTEMS AND METHOD

(71) Applicants: Ofer Naaman, Ellicott City, MD (US); Donald L Miller, Export, PA (US); Andrew Hostetler Miklich, Columbia, MD (US)

(72) Inventors: Ofer Naaman, Ellicott City, MD (US); Donald L Miller, Export, PA (US); Andrew Hostetler Miklich, Columbia, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 0 days.

(21) Appl. No.: 14/943,671

(22) Filed: Nov. 17, 2015

(51) Int. Cl.
*H03K 3/38* (2006.01)

(52) U.S. Cl.
CPC .................... *H03K 3/38* (2013.01)

(58) Field of Classification Search
CPC ........ H03K 17/92; H03K 3/38; B82Y 10/00; G06N 99/002; H01L 39/223
USPC ................................................. 327/367, 528
See application file for complete search history.

(56) References Cited

U.S. PATENT DOCUMENTS 4,621,203 A * 11/1986 Sweeny .................. 327/528
2015/0092465 A1* 4/2015 Herr et al. ............... 363/125

* cited by examiner

*Primary Examiner* — Quan Tra
(74) *Attorney, Agent, or Firm* — Tarolli, Sundheim, Covell & Tummino LLP

(57) ABSTRACT

One embodiment describes a Josephson current source system. The system includes a flux-shuttle loop comprising a plurality of stages arranged in a series loop. Each of the plurality of stages includes at least one Josephson junction. The flux-shuttle loop can be configured, when activated, to sequentially trigger the at least one Josephson junction in each of the plurality of stages about the flux-shuttle loop in response to an inductively-coupled AC clock signal to generate a DC output current provided through an output inductor. The system also includes a flux injector system that is configured to activate the flux-shuttle loop. The flux injector system is further configured to automatically deactivate the flux-shuttle loop in response to an amplitude of the DC output current increasing to a predetermined deactivation threshold.

20 Claims, 4 Drawing Sheets

250 

┌─ 252
| PROVIDE AN AC CLOCK SIGNAL THROUGH A PRIMARY INDUCTOR OF EACH OF A
| CLOCK TRANSFORMER, THE CLOCK TRANSFORMER COMPRISING A SECONDARY
| INDUCTOR ARRANGED IN A LOOP WITH AT LEAST TWO OF A PLURALITY OF LOOP
| STAGES OF A FLUX-SHUTTLE LOOP

┌─ 254
| PROVIDING A DC INJECTION SIGNAL TO A FLUX INJECTOR SYSTEM TO GENERATE
| A SINGLE FLUX QUANTUM (SFQ) PULSE AT ONE OF THE PLURALITY OF LOOP
| STAGES

FIG. 6

JOSEPHSON CURRENT SOURCE SYSTEMS AND METHOD

GOVERNMENT INTEREST

The invention was made under Contract Number W911NF-14-C-0115. Therefore, the US Government has rights to the invention as specified in that contract.

TECHNICAL FIELD

The present invention relates generally to quantum and classical digital superconducting circuits, and specifically to Josephson current source systems and method.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux quantum superconducting circuitry, utilizing superconducting Josephson junctions, and can exhibit typical power dissipation of less than 1 nW (nanowatt) per active device at a typical data rate of 20 Gb/s (gigabits/second) or greater, and can operate at temperatures of around 4 Kelvin. Certain superconducting circuits in which Josephson junctions are the active devices can require a DC current bias of the Josephson junctions. Typical systems can provide the DC bias current directly using a bias resistor network, which can result in spurious magnetic fields and heat resulting from high power dissipation. The power budget in such circuits can be dominated by static power consumption, which can be dissipated in the bias resistor network whether or not the active device is switching.

SUMMARY

One embodiment describes a Josephson current source system. The system includes a flux-shuttle loop comprising a plurality of stages arranged in a series loop. Each of the plurality of stages includes at least one Josephson junction. The flux-shuttle loop can be configured, when activated, to sequentially trigger the Josephson junctions in each of the plurality of stages about the flux-shuttle loop in response to an inductively-coupled AC clock signal to generate a DC output current provided through an output inductor. The system also includes a flux injector system that is configured to activate the flux-shuttle loop. The flux injector system is further configured to automatically deactivate the flux-shuttle loop in response to an amplitude of the DC output current increasing to a predetermined deactivation threshold.

Another embodiment includes a method for generating a DC output current. The method includes providing an AC clock signal through a primary inductor of a clock transformer. The clock transformer includes a secondary inductor arranged in a loop with at least two of a plurality of stages of a flux-shuttle loop. The plurality of stages can be arranged in a series sequential loop. The method further includes providing a DC injection signal to a flux injector system to generate a single flux quantum (SFQ) pulse at one of the plurality of stages. The SFQ pulse can be propagated through the plurality of stages to generate current steps in an output inductor to generate a DC output current based on a sequential triggering of a Josephson junction in each of the plurality of stages. The flux injector system can be configured to automatically deactivate and reactivate the flux-shuttle loop based on an amplitude of the DC output current relative to an amplitude of the DC injection signal.

Another embodiment describes a flux-shuttle loop comprising a first stage, a second stage, a third stage, and a fourth stage arranged in a series loop. Each of the first, second, third, and fourth stages includes at least one Josephson junction. The flux-shuttle loop can be configured, when activated, to sequentially trigger the Josephson junction in each of the first, second, third, and fourth stages about the flux-shuttle loop in response to an inductively-coupled AC clock signal comprising an in-phase component and a quadrature-phase component that are out-of-phase by approximately 90°. The system also includes a first storage inductor that is associated with the first and third stages and is configured to receive a current step associated with the sequential triggering of the Josephson junction in each of the first and third stages. The system also includes a second storage inductor that is associated with the second and fourth stages and is configured to receive a current step associated with the sequential triggering of the Josephson junction in each of the second and fourth stages. The system also includes an output inductor coupled to each of the first and second storage inductors and being configured to provide a DC output current in response to the current step provided via each of the first and second storage inductors. The system further includes a flux injector system that is configured to activate the flux-shuttle loop, and is further configured to automatically deactivate and reactivate the flux-shuttle loop based on an amplitude of the DC output current.

BRIEF DESCRIPTION OF THE DRAWINGS

FIG. 6 illustrates an example of a method for generating a DC output current.

DETAILED DESCRIPTION

Figure 1:
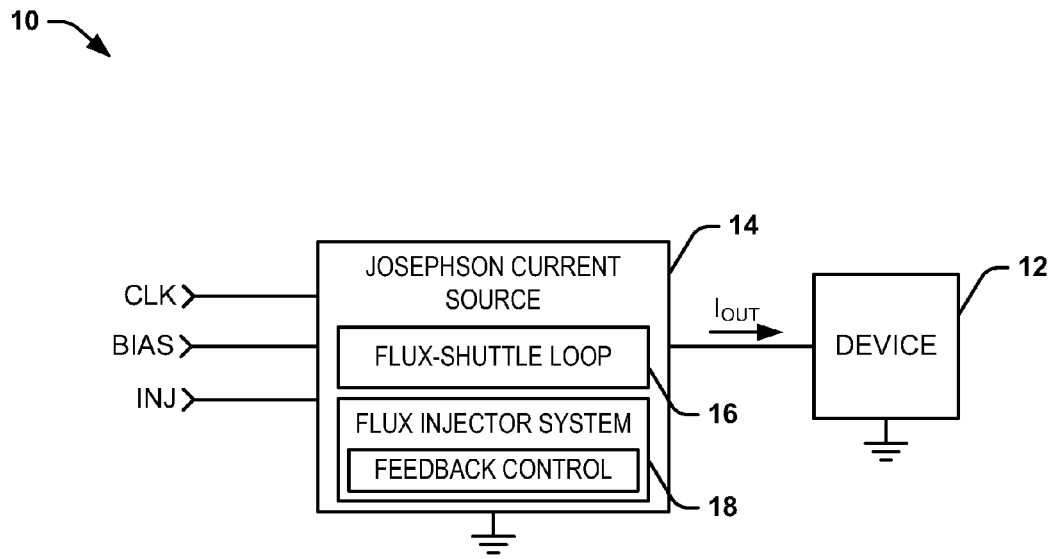
FIG. 1 illustrates an example of a superconducting circuit system.

The present invention relates generally to quantum and classical digital superconducting circuits, and specifically to Josephson current source systems and method. The Josephson current source includes a flux-shuttle loop comprising a plurality of stages that are arranged in a series loop. Each of the stages can be arranged as a superconducting quantum interference device (SQUID), and thus includes at least one Josephson junction. The Josephson current source also includes a set of clock transformers and bias transformers, a set of storage inductors that are each associated with at least one of the stages, and an output inductor configured to provide a DC output current. The clock transformers are configured to inductively couple an AC clock signal to the flux-shuttle loop, such that the AC clock signal provides a bias current in the flux-shuttle loop. The Josephson current source also includes a flux injector system. For example, at initialization, the flux injector system can be configured to inject a single-flux quantum (SFQ) pulse to activate the flux-shuttle loop based on the SFQ pulse propagating through each of the stages about the flux-shuttle loop. Thus, when the flux-shuttle is activated, the Josephson junction(s) in each of the stages triggers to sequentially propagate the SFQ pulse around the flux-shuttle loop based on the frequency of the AC clock signal. As an example, the SFQ pulse can propagate through a given stage at a positive or at a negative cycle of the AC clock signal. The SFQ pulse is provided to the storage inductor associated with the respective stage to provide a current step to the output inductor in response to a voltage pulse generated at the respective stage, such that the output inductor provides the DC output current based on the voltage pulses provided from each stage at each positive and negative cycles of the AC clock signal.

As an example, the AC clock signal can be a quadrature clock signal including an in-phase portion and a quadrature-phase portion, and the flux-shuttle loop can include four stages. A primary inductor of a first clock transformer can propagate the in-phase portion of the AC clock signal, and a secondary inductor of the first clock transformer can be arranged in series with the first and third stages. Similarly, a primary inductor of a second clock transformer can propagate the quadrature portion of the AC clock signal, and a secondary inductor of the second clock transformer can be arranged in series with the second and fourth stages. Therefore, the first stage and the second stage are set from a first flux state to a second flux state via the first clock transformer and the second clock transformer, respectively, in response to an SFQ pulse that is propagated in each of a first cycle (e.g., positive cycle) of the in-phase component and the quadrature-phase component, respectively, of the AC clock signal, and are reset from the second flux state to the first flux state in response to the SFQ pulse propagated in each of a second cycle (e.g., negative cycle) of the in-phase component and the quadrature-phase component, respectively, of the AC clock signal. Similarly, the third stage and the fourth stage are set from the second flux state to the first flux state via the first and second clock transformers, respectively, in response to the SFQ pulse propagated in each of the second cycle of the in-phase component and the quadrature-phase component, respectively, of the AC clock signal, and are reset from the first flux state to the second flux state in response to the SFQ pulse propagated in each of the first cycle of the in-phase component and the quadrature-phase component, respectively, of the AC clock signal.

In addition, the flux injector system is configured to automatically deactivate and reactivate the flux-shuttle loop based on the amplitude of the DC output current. As an example, the flux injector system can form a portion of the first stage, and can receive a DC injection signal that is inductively coupled to the flux injector system. Thus, the DC injection signal can generate an injection current in the flux injector system having an amplitude that can set an activation threshold and a deactivation threshold for the DC output signal. For example, the DC output signal can be inductively coupled to the flux injector system to provide a feedback current having a current direction that is opposite the injection current. Therefore, in response to the feedback current, and thus the DC output current, increasing greater than the deactivation threshold, the first stage has a flux that is less than sufficient to trigger the respective Josephson junction to maintain propagation of the SFQ pulse through the flux-shuttle loop, thus automatically deactivating the flux-shuttle loop. Accordingly, the flux-shuttle loop maintains a deactivated quiescent state that consumes approximately zero power. Upon the DC output current decreasing less than an activation threshold, such as in response to being consumed by an associated circuit device, the flux in the first stage increases sufficiently to trigger the respective Josephson junction, thus automatically reactivating the flux-shuttle loop to begin increasing the DC output current. Accordingly, the Josephson current source can activate and deactivate autonomously to meet current consumption demands in a more efficient manner.

FIG. 1 illustrates an example of a superconducting circuit system 10. As an example, the superconducting circuit system 10 can be implemented in any of a variety of classical and quantum computing applications, such as memory or processing systems. The superconducting circuit system 10 includes a device 12 that receives a DC output current, demonstrated in the example of FIG. 1 as a DC output current $I_{OUT}$. As an example, the DC output current $I_{OUT}$ can be provided as a driver signal to drive the device 12. For example, the device 12 can correspond to a memory driver, such as to provide a read current or a write current to a memory cell.

The superconducting circuit system 10 also includes a Josephson current source 14 that is configured to generate the DC output current $I_{OUT}$ in response to an AC clock signal CLK that can correspond to a clock signal associated with the Josephson current source 14. As an example, the clock signal CLK can be a sinusoidal waveform having a substantially constant frequency (e.g., approximately 5 GHz or 10 GHz) and an AC current magnitude, such as applicable to reciprocal quantum logic (RQL) superconducting circuits (e.g., approximately 2 mA RMS). The Josephson current source 14 is demonstrated as receiving a DC injection signal INJ that can be provided to the Josephson current source 14 to activate the Josephson current source 14 to generate the DC output current $I_{OUT}$. Additionally, as described in greater detail herein, the DC injection signal INJ can set a magnitude for at least one threshold for automatic deactivation and reactivation of the Josephson current source 14.

In the example of FIG. 1, the Josephson current source 14 includes a flux-shuttle loop 16. The flux-shuttle loop 16 can include a plurality of stages that are configured to propagate a single-flux quantum (SFQ) pulse (i.e., fluxon) around the flux-shuttle loop 16 based on the frequency of the clock signal CLK. As described herein, the term "propagate" with respect to an SFQ pulse describes an SFQ pulse being generated via the triggering of a Josephson junction in a given stage of the flux-shuttle loop, such that the voltage of the SFQ pulse, combined with a bias voltage (e.g., via the clock signal CLK), causes a Josephson junction of the next stage in the flux-shuttle loop to generate another SFQ pulse, and so on. As described herein, the term "loop" with respect to the flux-shuttle loop 16 describes a substantially continuous series loop (e.g., circular) arrangement of the stages of the flux-shuttle loop 16, such that a last stage can be coupled to a first stage. Therefore, the SFQ pulse can substantially continuously propagate around the flux-shuttle loop 16 upon activation of the flux-shuttle loop 16. Additionally, as described herein, the term "propagate around the flux-shuttle loop" with respect to an SFQ pulse describes an SFQ pulse being separately generated in each stage of the flux-shuttle loop 16, such that an SFQ pulse generated in one stage propagates to the next stage to generate another SFQ pulse, such that at a given phase of the AC clock signal CLK, an SFQ pulse propagates from one stage to the next in a sequential manner in each of the stages of the flux-shuttle loop 16.

As an example, the Josephson current source 14 also includes a set of clock transformers and bias transformers, a set of storage inductors that are each associated with at least one of the stages of the flux-shuttle loop 16, and an output inductor configured to provide the DC output current $I_{OUT}$.

The clock transformers are configured to inductively couple the AC clock signal CLK to the flux-shuttle loop 16, such that the AC clock signal CLK provides a bias current in the flux-shuttle loop 16. The Josephson current source 14 also includes a flux injector system 18. For example, at initialization, the flux injector system 18 can be configured to inject an SFQ pulse to activate the flux-shuttle loop 16 based on the SFQ pulse propagating through each of the stages about the flux-shuttle loop 16. Thus, when the flux-shuttle loop 16 is activated, the Josephson junction(s) in each of the stages triggers to propagate the SFQ pulse around the flux-shuttle loop 16 based on the frequency of the AC clock signal CLK. As an example, the SFQ pulse can propagate through a given stage at each positive or at each negative cycle of the AC clock signal CLK. The SFQ pulse is provided to the storage inductor associated with the respective stage to provide a current step to the output inductor, such that the output inductor provides the DC output current based on the voltage pulses provided from each stage at each positive and negative cycles of the AC clock signal. Therefore, the DC output current $I_{OUT}$ can flow through the output inductor based on the current steps being sequentially provided to the output inductor based on the frequency of the clock signal CLK. For example, the current steps can be generated based on the SFQ pulses providing a small voltage (e.g., approximately 2 µV/GHz) to each of the storage inductors, such that the resulting voltage pulses can be integrated in the output inductor to provide the DC output current $I_{OUT}$.

In addition, the flux injector system 18 includes a feedback control mechanism 20 that is configured to automatically deactivate and reactivate the flux-shuttle loop 16 based on an amplitude of the DC output current $I_{OUT}$. For example, the flux injector system 18 can form a portion of the first stage of the flux-shuttle loop 16. As an example, the flux injector system 18 can include inductive coupling of each of the DC output current $I_{OUT}$ and the DC injection signal INJ to provide a feedback current and an injection current, respectively, having opposite current directions in the flux injector system 18. Therefore, in response to the feedback current, and thus the DC output current $I_{OUT}$, increasing greater than a deactivation threshold, the first stage of the flux-shuttle loop 16 has a flux that is less than sufficient to trigger the respective Josephson junction to maintain propagation of the SFQ pulse through the flux-shuttle loop 16, thus automatically deactivating the flux-shuttle loop 16. Accordingly, the flux-shuttle loop 16 maintains a deactivated quiescent state that consumes approximately zero power. Upon the DC output current $I_{OUT}$ decreasing less than an activation threshold, such as in response to being consumed by the circuit device 12, the flux in the first stage of the flux-shuttle loop 16 increases sufficiently to trigger the respective Josephson junction, thus automatically reactivating the flux-shuttle loop to begin increasing the DC output current $I_{OUT}$. The Josephson current source 14 can therefore operate to generate the DC output current $I_{OUT}$ in a power efficient manner. As an example, the Josephson current source 14 can generate substantially no heat from static power dissipation, as opposed to typical resistance-based DC current sources. Accordingly, the Josephson current source 14 can operate more efficiently and effectively than typical current sources, particularly in a quantum computing and energy-efficient high-performance computing environments, based on the automatic deactivation of the flux injector system 18 in response to the DC output current $I_{OUT}$ being sufficiently high to meet the current bias demands of the circuit device 12. In addition, as described in greater detail herein, the amplitude of the DC injection signal INJ can set at least one of the activation and deactivation thresholds for automatic deactivation and reactivation the flux-shuttle loop 16.

Figure 2:
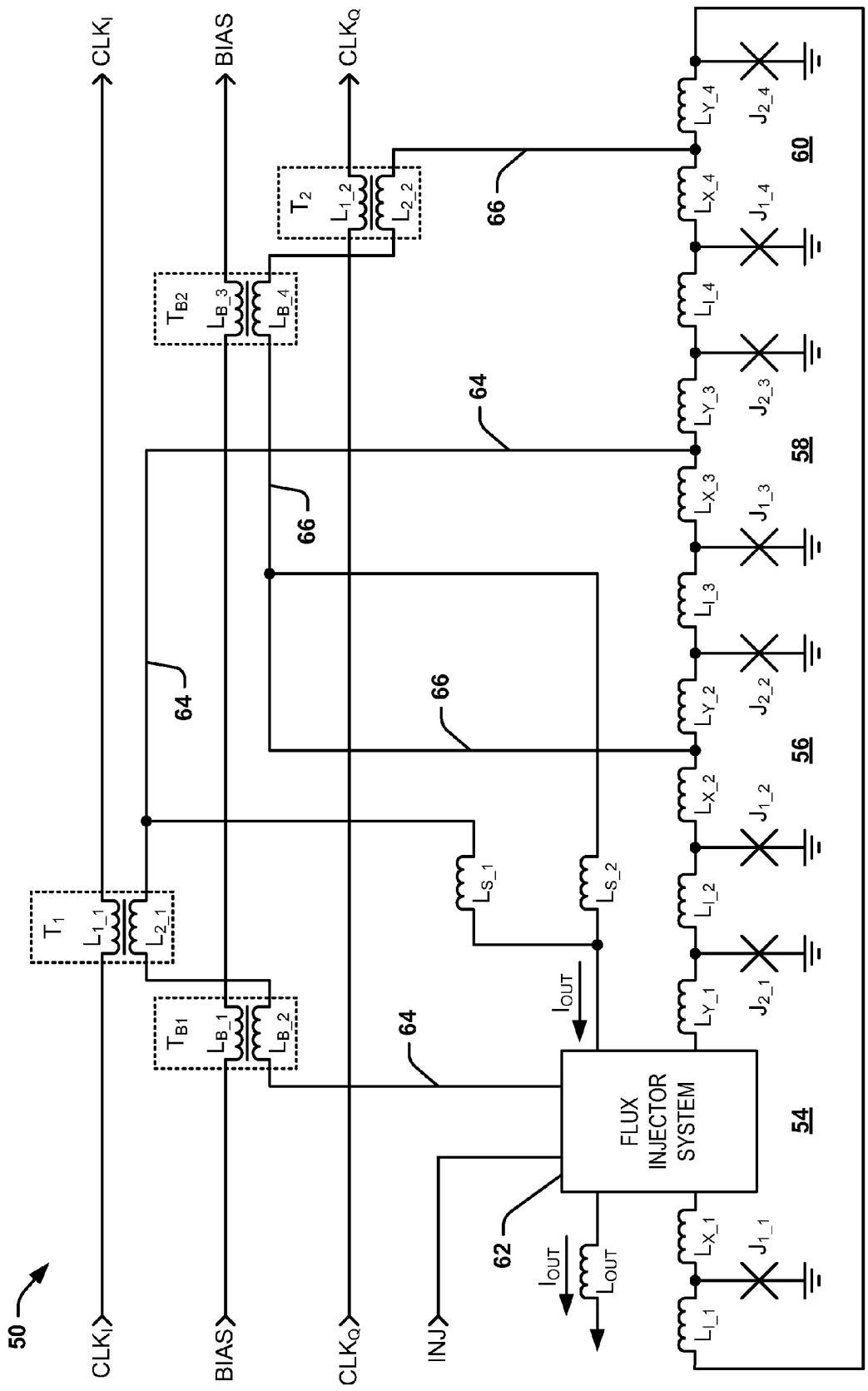
FIG. 2 illustrates an example of a Josephson current source circuit.

FIG. 2 illustrates an example of a Josephson current source circuit 50. The Josephson current source circuit 50 can correspond to Josephson current source 14 in the superconducting circuit system 10. Therefore, the Josephson current source circuit 50 includes a flux-shuttle loop 52 that includes a plurality of stages, demonstrated in the example of FIG. 2 as a first stage 54, a second stage 56, a third stage 58, and a fourth stage 60. The stages 54, 56, 58, and 60 are sequentially coupled to form a series loop arrangement. The Josephson current source circuit 50 is configured to generate a DC output current based on an AC clock signal. In the example of FIG. 2, the AC clock signal is demonstrated as a quadrature clock signal including an in-phase component $CLK_I$ and a quadrature-phase component $CLK_Q$. As an example, the in-phase component $CLK_I$ and the quadrature-phase component $CLK_Q$ can collectively correspond to the AC clock signal that can be implemented for RQL circuits. The DC output current is demonstrated as a current $I_{OUT}$ that flows through an output inductor $L_{OUT}$.

Each of the stages 54, 56, 58, and 60 are each substantially configured in a SQUID arrangement, with the stages 56, 58, and 60 being substantially similarly with respect to each other. In the example of FIG. 2, the first stage 54 includes a first Josephson junction $J_{1\_1}$, a second Josephson junction $J_{2\_1}$, an inductor $L_{X\_1}$, and an inductor $L_{Y\_1}$. The second stage 56 includes a first Josephson junction $J_{1\_2}$, a second Josephson junction $J_{2\_2}$, an inductor $L_{X\_2}$, and an inductor $L_{Y\_2}$. The third stage 58 includes a first Josephson junction $J_{1\_3}$, a second Josephson junction $J_{2\_3}$, an inductor $L_{X\_3}$, and an inductor $L_{Y\_3}$. The fourth stage 60 includes a first Josephson junction $J_{1\_4}$, a second Josephson junction $J_{2\_4}$, an inductor $L_{X\_4}$, and an inductor $L_{Y\_4}$. Additionally, the Josephson current source 50 includes a flux injector system 62 that forms part of the first stage 54 and is configured, during initialization, to inject an SFQ pulse into the flux-shuttle loop 52. As an example, the flux injector system 62 can have a self-series inductance that is different from the other stages 56, 58, and 60. The first stage 54 is separated from the second stage 56 by an inductor $L_{I\_2}$, and the second stage 56 and the third stage 58 are separated by an inductor $L_{I\_3}$. The third stage 58 and the fourth stage 60 are separated by an inductor $L_{I\_4}$, and the fourth stage 60 is separated from the first stage 54 by an inductor $L_{I\_1}$. Therefore, the SFQ pulse that is generated by the flux injector system 62 can circulate through the flux-shuttle loop 52 in the loop formed by the stages 54, 56, 58, and 60.

The Josephson current source 50 also includes a pair of clock transformers that are each associated with a pair of the stages 54, 56, 58, and 60. In the example of FIG. 2, the clock transformers include a first clock transformer $T_1$ that is associated with the first stage 54 and the third stage 58 and a second clock transformer $T_2$ that is associated with the second stage 56 and the fourth stage 60. Additionally, the Josephson current source 50 includes a first bias transformer $T_{B1}$ that is likewise associated with the first and third stages 54 and 58 and second bias transformer $T_{B2}$ that is likewise associated with the second and fourth stages 56 and 60.

The clock transformer $T_1$ includes a primary inductor $L_{1\_1}$ through which the in-phase component $CLK_I$ flows, and the clock transformer $T_2$ includes a primary inductor $L_{1\_2}$ through which the quadrature-phase component $CLK_Q$ flows. In addition, the bias transformers $T_{B1}$ and $T_{B2}$ include respective primary inductors $L_{B\_1}$ and $L_{B\_3}$ through which a DC bias signal BIAS flows. The clock transformer $T_1$ provides inductive coupling of the in-phase component $CLK_I$ to the first stage 54 (e.g., via the flux injector system 62, as described in greater detail herein) and the third stage 58 via a secondary inductor $L_{2\_1}$ that is arranged in series with a secondary inductor $L_{B\_2}$ of the first bias transformer $T_{B1}$ (e.g., coupled between the inductors $L_{X\_1}$ and $L_{Y\_1}$ and the inductors $L_{X\_3}$ and $L_{Y\_3}$). Similarly, the clock transformer $T_2$ provides inductive coupling of the quadrature-phase component $CLK_Q$ to the second stage 56 and the fourth stage 60 via a secondary inductor $L_{2\_2}$ that is arranged in series with a secondary inductor $L_{B\_4}$ of the second bias transformer $T_{B2}$ (e.g., coupled between the inductors $L_{X\_2}$ and $L_{Y\_2}$ and the inductors $L_{X\_4}$ and $L_{Y\_4}$). Therefore, the secondary inductors $L_{1\_2}$ and $L_{B\_2}$ of the respective transformers $T_1$ and $T_{B1}$ form a first loop 64 between the first and third stages 54 and 58. In a similar manner, the secondary inductors $L_{2\_2}$ and $L_{B\_4}$ of the respective transformers $T_2$ and $T_{B2}$ form a second loop 66 between the second and fourth stages 56 and 62.

As an example, each of the in-phase component $CLK_I$ and the quadrature-phase component $CLK_Q$ can include a positive portion (e.g., in a first half of a respective period) and a negative portion (e.g., in a second half of a respective period). Based on the arrangement of the clock transformers $T_1$ and $T_2$ relative to the respective stages 54, 56, 58, and 60, a flux state of the stages 54, 56, 58, and 60 can be sequentially switched at each phase and each opposite phase of the in-phase and quadrature-phase components $CLK_I$ and $CLK_Q$ and in response to an SFQ propagating around the flux-shuttle loop. As an example, each of the in-phase component $CLK_I$ and the quadrature-phase component $CLK_Q$ can include a first phase corresponding to a positive peak (e.g., in a first half of a respective period) and a second phase that is opposite the first phase, and thus corresponding to a negative peak (e.g., in a second half of a respective period). Thus, the flux-shuttle loop 52 can track the flux state of the secondary inductors $L_{B\_2}$ and $L_{B\_4}$ of the bias transformers $T_{B1}$ and $T_{B2}$, and thus the flux state of the stages 54, 56, 58, and 60 through each alternating first and second phase of the in-phase and quadrature-phase components $CLK_I$ and $CLK_Q$ to propagate an SFQ pulse through the flux-shuttle loop 52.

Furthermore, the Josephson current source 50 includes a first storage inductor $L_{S\_1}$ that interconnects the flux injector system 62 and the first loop 64, and a second storage inductor $L_{S\_2}$ that interconnects the flux injector system 62 and the second loop 66. The output inductor $L_{OUT}$ conducts the output current $I_{OUT}$ from each of the storage inductors $L_{S\_1}$ and $L_{S\_2}$ through the injector system 62. In response to the SFQ pulse that is sequentially propagated through each of the stages 54, 56, 58, and 60, a current step is generated in the respective storage inductors $L_{S\_1}$ and $L_{S\_2}$. Thus, in response to the respective Josephson junctions triggering in the first and third stages 54 and 58 in response to the switching of the flux states of the respective first and third stages 54 and 58, the SFQ pulse generates a resulting current step in the storage inductor $L_{S\_1}$. Similarly, in response to the respective Josephson junctions triggering in the second and fourth stages 56 and 60 in response to the switching of the flux states of the respective second and fourth stages 56 and 60, the SFQ pulse generates a resulting current step in the storage inductor $L_{S\_2}$. As a result, the output inductor $L_{OUT}$ integrates each of the current steps provided through the storage inductors $L_{S\_1}$ and $L_{S\_2}$ to provide the output current $I_{OUT}$, such that the Josephson current source 50 acts as a DC signal source. As a result, the output current $I_{OUT}$ can be provided as a DC signal converted from the in-phase component $CLK_I$ and the quadrature-phase component $CLK_Q$, such as to a circuit device (e.g., the circuit device 12 in the example of FIG. 1).

Figure 3:
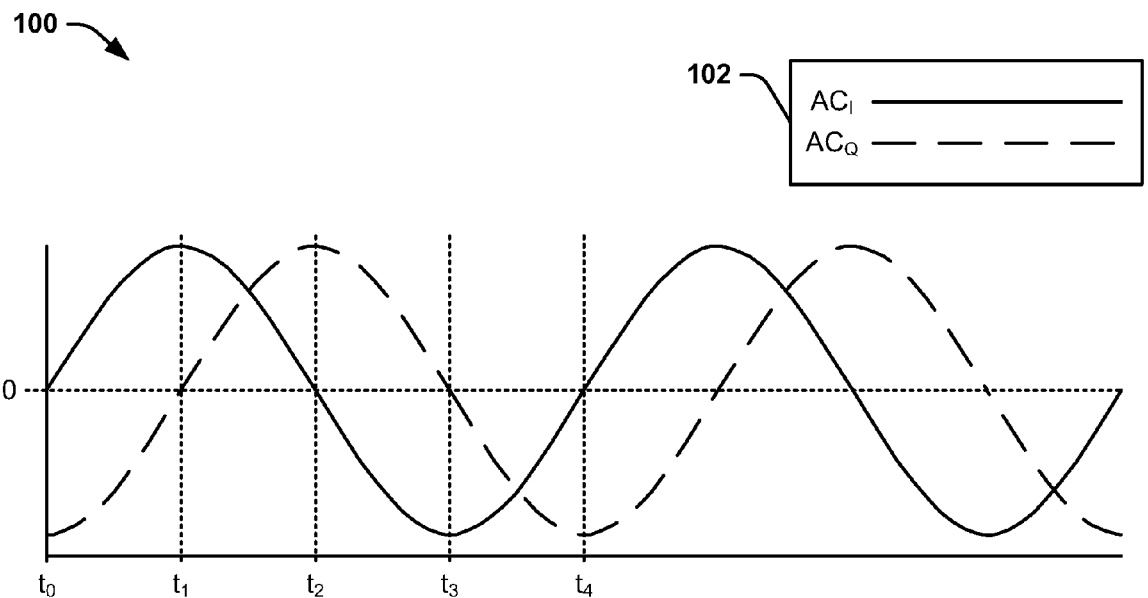
FIG. 3 illustrates an example of a timing diagram.

FIG. 3 illustrates an example of a timing diagram 100. The timing diagram 100 includes the in-phase component $CLK_I$ and the quadrature-phase component $CLK_Q$, as indicated at the legend 102, as a function of time. The in-phase component $CLK_I$ and the quadrature-phase component $CLK_Q$ are each demonstrated as sinusoidal signals having magnitudes centered about zero. The in-phase component $CLK_I$ and the quadrature-phase component $CLK_Q$ in the example of FIG. 3 can correspond to the in-phase component $CLK_I$ and the quadrature-phase component $CLK_Q$ in the example of FIG. 2. Therefore, reference is to be made to the example of FIG. 2 in the following description of the example of FIG. 3.

The flux-shuttle loop 52 can be activated via the flux injector system 62, as described in greater detail herein. Upon activation, at a time $t_0$, a positive portion of the in-phase component $CLK_I$ begins, with a positive peak of the in-phase component $CLK_I$ occurring at a time $t_1$. Therefore, the in-phase component $CLK_I$ begins to induce a current via the secondary inductor $L_{2\_1}$ based on the inductive coupling with the primary inductor $L_{1\_1}$. At a time just prior to the time $t_1$ (e.g., based on the inductance of the transformer $T_1$), the magnitude of the current is combined with an SFQ pulse provided by the Josephson junction $J_{2\_4}$ (e.g., from the fourth stage 60 via the inductor $L_{1\_1}$) or from the flux injector system 62 at activation and a bias current provided via the secondary inductor $L_{B\_2}$ based on the inductive coupling with the primary inductor $L_{B\_1}$. Therefore, the critical current of the Josephson junctions $J_{1\_1}$ and $J_{2\_1}$ is exceeded, thus triggering the Josephson junctions $J_{1\_1}$ and $J_{2\_1}$ (or just the Josephson junction $J_{2\_1}$ at initialization). As a result, the Josephson junctions $J_{1\_1}$ and $J_{2\_1}$ propagate the SFQ pulse, which provides a voltage pulse to the first storage inductor $L_{S\_1}$ that is integrated by the output inductor $L_{OUT}$ to increase the amplitude of the DC output current $I_{OUT}$. The SFQ pulse then propagates to the second stage 56.

Also, at the time $t_1$, a positive portion of the quadrature-phase component $CLK_Q$ begins, with a positive peak of the quadrature-phase component $CLK_Q$ occurring at a time $t_2$. Therefore, the quadrature-phase component $CLK_Q$ begins to induce a current via the secondary inductor $L_{2\_2}$ based on the inductive coupling with the primary inductor $L_{1\_2}$. At a time just prior to the time $t_2$ (e.g., based on the inductance of the transformer $T_2$), the magnitude of the current is combined with the SFQ pulse provided by the Josephson junction $J_{2\_1}$ and a bias current provided via the secondary inductor $L_{B\_4}$ based on the inductive coupling with the primary inductor $L_{B\_2}$. Therefore, the critical current of the Josephson junctions $J_{1\_2}$ and $J_{2\_2}$ is exceeded, thus triggering the Josephson junction $J_{2\_2}$. As a result, the Josephson junctions $J_{1\_2}$ and $J_{2\_2}$ propagate the SFQ pulse, which generates a current step in the storage inductor $L_{S\_2}$ that is integrated by the output inductor $L_{OUT}$ to increase the amplitude of the DC output current $I_{OUT}$. The SFQ pulse then propagates to the third stage 58.

Also, at the time $t_2$, a negative portion of the in-phase component $CLK_I$ begins, with a negative peak of the in-phase component $CLK_I$ occurring at a time $t_3$. Therefore, the in-phase component $CLK_I$ begins to induce a current via the secondary inductor $L_{2\_1}$ based on the inductive coupling with the primary inductor $L_{1\_1}$. At a time just prior to the time $t_3$, the magnitude of the current is combined with the SFQ pulse propagated by the Josephson junction $J_{2\_2}$ and the bias current provided via the secondary inductor $L_{B\_2}$. Therefore, the critical current of the Josephson junctions $J_{1\_3}$ and $J_{2\_3}$ is exceeded, thus triggering the Josephson junctions $J_{1\_3}$ and $J_{2\_3}$. As a result, the Josephson junctions $J_{1\_3}$ and $J_{2\_3}$ propagate the SFQ pulse, which generates a current step in the storage inductor $L_{S\_1}$ that is integrated by the output inductor $L_{OUT}$ to increase the amplitude of the DC output current $I_{OUT}$. The SFQ pulse then propagates to the fourth stage 60.

Also, at the time $t_3$, a negative portion of the quadrature-phase component $CLK_Q$ begins, with a negative peak of the quadrature-phase component $CLK_Q$ occurring at a time $t_4$. Therefore, the quadrature-phase component $CLK_Q$ begins to induce a current via the secondary inductor $L_{2\_4}$ based on the inductive coupling with the primary inductor $L_{1\_4}$. At a time just prior to the time $t_4$, the magnitude of the current is combined with the SFQ pulse propagated by the Josephson junction $J_{2\_3}$ and the bias current provided via the secondary inductor $L_{B\_4}$. Therefore, the critical current of the Josephson junctions $J_{1\_4}$ and $J_{2\_4}$ is exceeded, thus triggering the Josephson junctions $J_{1\_4}$ $J_{2\_4}$. As a result, the Josephson junctions $J_{1\_4}$ $J_{2\_4}$ propagate the SFQ pulse, which generates a current step in the storage inductor $L_{S\_2}$ that is integrated by the output inductor $L_{OUT}$ to increase the amplitude of the DC output current $I_{OUT}$. The SFQ pulse then propagates back to the first stage 54 to trigger the Josephson junction $J_{1\_1}$.

Also, at the time $t_4$, a positive portion of the in-phase component $CLK_I$ begins. Therefore, the process of converting the in-phase component $CLK_I$ and the quadrature-phase component $CLK_Q$ repeats, such that the time $t_4$ is equivalent to the time $t_0$, as described previously. Accordingly, the Josephson junctions $J_{1\_1}$, $J_{2\_1}$, $J_{1\_2}$, $J_{2\_2}$, $J_{1\_3}$, $J_{2\_3}$, $J_{1\_4}$, and $J_{2\_4}$ can sequentially trigger based on changes to the flux states of the first and second loops 64 and 66, and thus the corresponding stages 54, 56, 58, and 60, while the flux-shuttle loop 52 is activated via the flux injector system 62. Thus, the SFQ pulse propagates around the flux-shuttle loop 52 to continuously provide voltage pulses in response to the triggering of the Josephson junctions $J_{2\_1}$, $J_{2\_2}$, $J_{2\_3}$, and $J_{2\_4}$, respectively, to the output inductor $L_{OUT}$ based on the frequency of the in-phase component $CLK_I$ and the quadrature-phase component $CLK_Q$. As a result, the output inductor $L_{OUT}$ can integrate the voltage pulses to increase the amplitude of the DC output current $I_{OUT}$.

Figure 4:
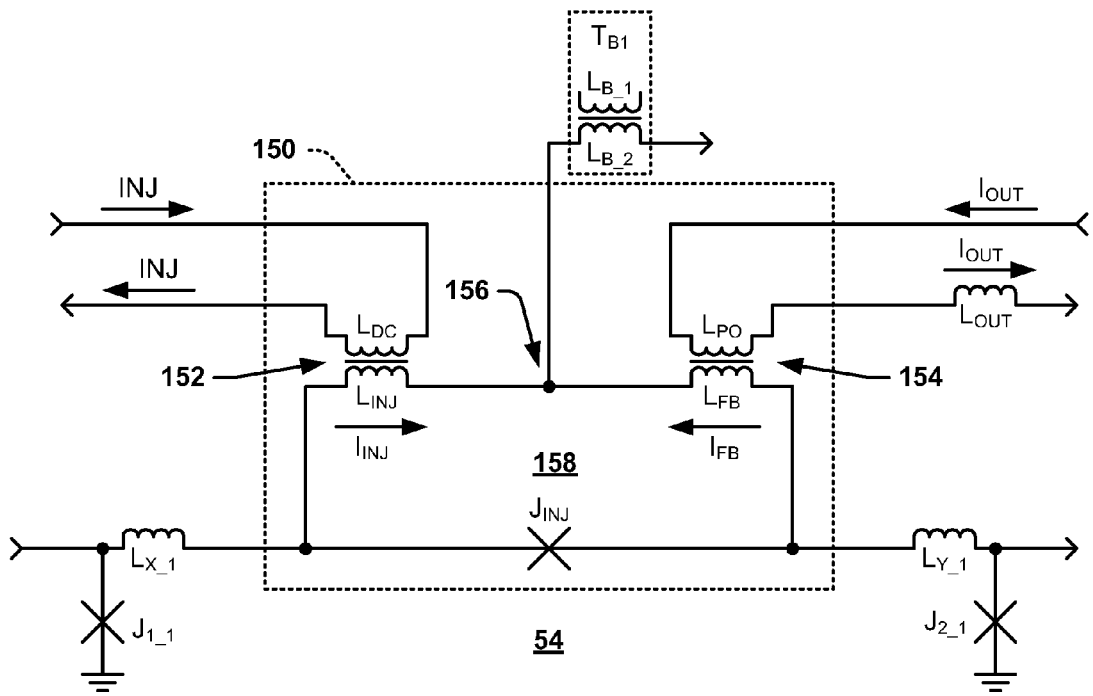
FIG. 4 illustrates an example of a flux injector system.

FIG. 4 illustrates an example of a flux injector system 150. The flux injector system 150 is configured to automatically activate (e.g., reactivate) and deactivate an associated flux-shuttle loop. The flux injector system 150 can correspond to the flux injector system 18 in the example of FIG. 1 and/or the flux injector system 62 in the example of FIG. 2. Therefore, reference is to be made to the example of FIGS. 1-3 in the following description of the example of FIG. 4.

The flux injector system 150 is demonstrated as forming part of the first stage 54 between the inductors $L_{X\_1}$ and $L_{Y\_1}$. The flux injector system 150 includes a first transformer 152 having a primary inductor $L_{DC}$ that receives the DC injection signal INJ and a secondary inductor $L_{INJ}$ that provides an induced injection current $I_{INJ}$. The flux injector system 150 also includes a second transformer 154 having a primary inductor $L_{PO}$ that receives the DC output current $I_{OUT}$ and a secondary inductor $L_{FB}$ that provides an induced feedback current $I_{FB}$. The secondary inductors $L_{INJ}$ and $L_{FB}$ are interconnected by a node 156 that is coupled to the secondary inductor $L_{B\_2}$ of the first bias transformer $T_{B1}$ and are arranged in a loop 158 with a Josephson junction $J_{INJ}$ that is arranged between the inductors $L_{X\_1}$ and $L_{Y\_1}$. In the example of FIG. 4, the feedback current $I_{FB}$ and the injection current $I_{INJ}$ have opposite current directions, and thus the activation and deactivation of the Josephson current source 50 can be controlled based on a relative amplitude of the feedback current $I_{FB}$ and the injection current $I_{INJ}$.

At initialization (e.g., approximately zero amplitude of the DC output current $I_{OUT}$), the DC injection signal INJ can be provided through the primary inductor $L_{DC}$ of the transformer 152 to provide the induced injection current $I_{INJ}$. Because the amplitude of the DC output current $I_{OUT}$ is approximately zero at initialization, the net current flow in the loop 158 is defined entirely by the injection current $I_{INJ}$, which can provide a flux of the loop 158 that is sufficient to trigger the Josephson junction $J_{INJ}$ to inject an SFQ pulse into the flux-shuttle loop 52. Therefore, the SFQ pulse can circulate through the flux-shuttle loop 52 in the manner described previously in the examples of FIGS. 2 and 3. As the SFQ pulse continues to propagate around the flux-shuttle loop 52, the DC output current $I_{OUT}$ increases, thus likewise increasing the amplitude of the feedback current $I_{FB}$. As a result, the amplitude of the feedback current $I_{FB}$ is subtracted from the injection current $I_{INJ}$ with respect to the flux of the loop 158, thus decreasing the flux of the loop 158. Upon the DC output current $I_{OUT}$ increasing to a predetermined deactivation threshold that can be defined by the amplitude of the DC injection signal INJ, and thus the injection current $I_{INJ}$, the flux of the loop 158 can decrease to an amount that is sufficient to provide an anti-triggering the Josephson junction $J_{INJ}$ by generating a negative SFQ pulse (i.e., anti-fluxon) at the first phase of the in-phase component $CLK_I$. As a result, the junction $J_{INJ}$ un-triggers to cancel the SFQ pulse, such that the SFQ pulse ceases to propagate around the flux-shuttle loop 52, thus maintaining the amplitude of the DC output current $I_{OUT}$ at a substantially constant amplitude in a quiescent state. Therefore, the flux injector system 150 can automatically deactivate the Josephson current source 50 based on an amplitude of the DC output current $I_{OUT}$.

In response to a decrease in the amplitude of the DC output current $I_{out}$, such as in response to the DC output current $I_{DC}$ being consumed by the circuit device 12, the flux of the loop 158 begins to increase as the net current flow in the loop 158 increases. Upon the DC output current $I_{OUT}$ decreasing to a predetermined activation threshold, such as likewise defined by the amplitude of the DC injection signal INJ, and thus the injection current $I_{INJ}$, the flux of the loop 158 can increase to an amount that is sufficient to trigger the Josephson junction $J_{INJ}$, thus re-injecting the SFQ pulse into the flux-shuttle loop 52. Accordingly, the SFQ pulse can again circulate through the flux-shuttle loop 52 to increase the DC output current $I_{DC}$. Therefore, the flux injector system 150 can automatically reactivate the Josephson current source 50 based on an amplitude of the DC output current $I_{OUT}$.

Figure 5:
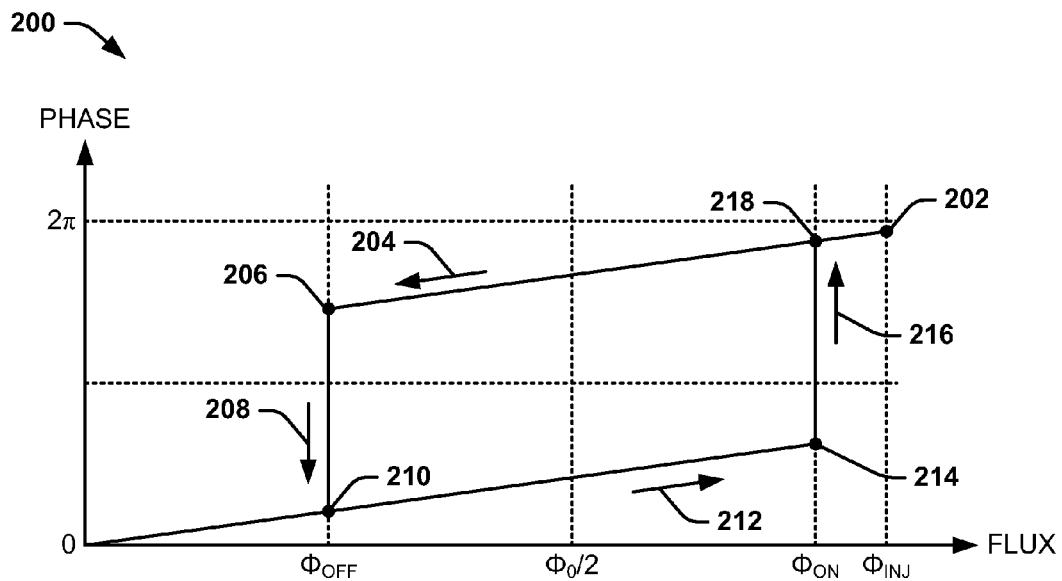
FIG. 5 illustrates an example of a flux diagram.

FIG. 5 illustrates an example of a flux diagram 200. The flux diagram 200 can correspond to the operation of the flux injector system 150. In the example of FIG. 5, the flux diagram 200 demonstrates a plot of a superconducting phase ("PHASE") of the Josephson junction $J_{INJ}$ relative to a flux ("FLUX") of the loop 158. Therefore, reference is to be made to the example of FIGS. 2-4 in the following description of the example of FIG. 5.

The flux diagram 200 demonstrates a first point 202 corresponding to the state of the system at the completion of initialization of the Josephson current source 50 in response to the applied current $I_{INJ}$, and therefore, approximately zero amplitude of the DC output current $I_{OUT}$. At the first point 202, the DC injection signal INJ can be provided through the primary inductor $L_{DC}$ of the transformer 152 to provide the induced injection current $I_{INJ}$. Because the amplitude of the DC output current $I_{OUT}$ is approximately zero at initialization, the net current flow in the loop 158 is defined entirely by the injection current $I_{INJ}$, which can provide a flux of $\Phi_{INJ}$ to the loop 158, which can be sufficient to trigger the Josephson junction $J_{INJ}$ to inject an SFQ pulse into the flux-shuttle loop 52. Therefore, the flux-shuttle loop 52 can be activated to circulate the SFQ pulse through the flux-shuttle loop 52 in the manner described previously in the examples of FIGS. 2 and 3.

As the SFQ pulse continues to propagate around the flux-shuttle loop 52, the DC output current $I_{OUT}$ increases, thus likewise increasing the amplitude of the feedback current $I_{FB}$. As a result, the amplitude of the feedback current $I_{FB}$ is subtracted from the injection current $I_{INJ}$ with respect to the flux of the loop 158, thus decreasing the flux of the loop 158, as demonstrated by the arrow 204. Upon the DC output current $I_{OUT}$ increasing to a predetermined deactivation threshold that can be defined by the amplitude of the DC injection signal INJ, and thus the injection current $I_{INJ}$, the flux of the loop 158 can decrease to a point 206 corresponding to a flux $\Phi_{OFF}$. The flux $\Phi_{OFF}$ can correspond to a flux of the loop 158 that is sufficient to provide an anti-trigger of the Josephson junction $J_{INJ}$, and thus a negative SFQ pulse, to cancel the SFQ pulse that is provided from the Josephson junction $J_{1\_1}$ at the first phase of the in-phase component $CLK_I$, and thus failing to trigger the Josephson junction $J_{2\_1}$. Therefore, the anti-triggering of the Josephson junction $J_{INJ}$ results in a decrease of phase, as indicated by the arrow 208, from the point 206 to a point 210. Accordingly, the flux-shuttle loop 52 is automatically deactivated, resulting in the SFQ pulse ceasing to propagate around the flux-shuttle loop 52, thus maintaining the amplitude of the DC output current $I_{OUT}$ at a substantially constant amplitude in a quiescent state.

In response to a decrease in the amplitude of the DC output current $I_{DC}$, such as in response to the DC output current $I_{OUT}$ being consumed by the circuit device 12, the flux of the loop 158 begins to increase, as demonstrated by an arrow 212, as the net current flow in the loop 158 increases. In response to the flux increasing to a point 214 corresponding to a flux $\Phi_{ON}$, the flux of the loop 158 can achieve a predetermined activation threshold, such as likewise defined by the amplitude of the DC injection signal INJ, and thus the injection current $I_{INJ}$. Therefore, the flux $\Phi_{ON}$ can correspond to a flux of the loop 158 that is sufficient to trigger the Josephson junction $J_{INJ}$, thus increasing the phase of the Josephson junction $J_{INJ}$, as indicated by an arrow 216, from the point 214 to a point 218. As a result, the SFQ pulse is re-injected into the flux-shuttle loop 52. Therefore, the SFQ pulse can again circulate through the flux-shuttle loop 52 to increase the DC output current $I_{OUT}$. Accordingly, the flux diagram 200 demonstrates a circular pattern of the flux of the loop 158 as it relates to the phase of the Josephson junction $J_{INJ}$, and thus activation and deactivation of the flux-shuttle loop 52, based on the amplitude of the DC output current $I_{OUT}$.

In the example of FIG. 5, the fluxes $\Phi_{ON}$ and $\Phi_{OFF}$ are dependent on the ratio of the inductance of the Josephson Junction $J_{INJ}$ and the loop 158, and are therefore substantially fixed. The flux $\Phi_{INJ}$ is dependent on a relative amplitude of the injection current $I_{INJ}$ and the feedback current $I_{FB}$, and thus on the amplitude of the DC injection signal INJ and the amplitude of the DC output current $I_{OUT}$, respectively. The feedback current $I_{FB}$ affects the total flux of the loop 158, and depends on the DC injection signal INJ relative to the fluxes $\Phi_{ON}$ and $\Phi_{OFF}$. Therefore, the amplitude of the output current $I_{OUT}$ is controlled based on the amount of the feedback current $I_{FB}$ that is necessary to increase the total flux of the loop 158 to the flux $\Phi_{ON}$ or to decrease the total flux of the loop 158 to the flux $\Phi_{OFF}$. Accordingly, the amplitude of the DC injection signal INJ defines the amplitude of the feedback current $I_{FB}$ that is necessary to achieve the total loop flux of $\Phi_{ON}$ or $\Phi_{OFF}$ for the loop 158. Therefore, the amplitude of the DC injection signal INJ can be set to define at least one of the predetermined activation and deactivation thresholds for the Josephson current source 50.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 250 for generating a DC output current (e.g., the DC output current $I_{OUT}$). At 252, an AC clock signal (e.g., the AC clock signal CLK) is provided through a primary inductor (e.g., the primary inductors $L_{1\_1}$ and $L_{1\_2}$) of each of a clock transformer (e.g., the clock transformers $T_1$ and $T_2$). The clock transformer can include a secondary inductor (e.g., the secondary inductors $L_{2\_1}$ and $L_{2\_2}$) arranged in a loop (e.g., the loops 64 and 66) with at least two of a plurality of stages (e.g., the stages 54, 56, 58, and 60) of a flux-shuttle loop (e.g., the flux shuttle loop 52). The plurality of stages can be arranged in a series sequential loop. At 254, a DC injection signal (e.g., the DC injection signal INJ) is provided to a flux injector system (e.g., the flux injector system 62) to generate an SFQ pulse at one of the plurality of stages. The SFQ pulse can be propagated through the plurality of stages to generate voltage pulses in an output inductor (e.g., the output inductor $L_{OUT}$) to generate the DC output current based on a sequential triggering of a Josephson junction (e.g., the Josephson junctions $J_{2\_1}$, $J_{2\_2}$, $J_{2\_3}$, and $J_{2\_4}$) in each of the plurality of stages. The flux injector system can be configured to automatically deactivate and reactivate the flux-shuttle loop based on an amplitude of the DC output current relative to an amplitude of the DC injection signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A Josephson current source system comprising:
   a flux-shuttle loop comprising a plurality of stages arranged in a series loop, each of the plurality of stages comprising at least one Josephson junction, the flux-shuttle loop being configured, when activated, to sequentially trigger the at least one Josephson junction in each of the plurality of stages about the flux-shuttle loop in response to an inductively-coupled AC clock signal to generate a DC output current provided through an output inductor; and
   a flux injector system that is configured to activate the flux-shuttle loop, and is further configured to automatically deactivate the flux-shuttle loop in response to an amplitude of the DC output current increasing to a predetermined deactivation threshold.

2. The system of claim 1, wherein the flux injector system is further configured to automatically reactivate the flux-shuttle loop in response to an amplitude of the DC output current decreasing to a predetermined activation threshold.

3. The system of claim 1, further comprising:
   a plurality of storage inductors that are each coupled to at least one of the plurality of stages and are each configured to receive a voltage pulse associated with the sequential triggering of the Josephson junction in each of the plurality of stages; and
   an output inductor coupled to each of the plurality of storage inductors and being configured to provide the DC output current in response to the voltage pulse provided via each of the plurality of storage inductors.

4. The system of claim 1, wherein the flux injector system comprises an injection transformer that is inductively coupled to the flux injector system, the injection transformer being configured to induce an injection current based on a DC injection signal to inject a single-flux quantum (SFQ) pulse in response to the DC output current being less than or equal to a predetermined activation threshold and to inject a negative SFQ pulse in response to the DC output current being greater than the predetermined deactivation threshold.

5. The system of claim 4, wherein the flux injector system forms a portion of one of the plurality of stages, wherein the DC injection signal has a predetermined amplitude that defines both the predetermined activation threshold and the predetermined deactivation threshold based on a flux of the respective one of the plurality of stages.

6. The system of claim 4, wherein the flux injector system further comprises a feedback transformer that is inductively coupled to the flux injector system, the feedback transformer being configured to induce a feedback current based on the DC output current, wherein the feedback current has a current direction that is opposite the injection current to automatically deactivate and reactivate the flux-shuttle loop based on the amplitude of the feedback current relative to the amplitude of the injection current.

7. The system of claim 1, wherein the AC clock signal comprises an in-phase component and a quadrature-phase component, the in-phase and quadrature phase components being out-of-phase by approximately 90°.

8. The system of claim 7, wherein the plurality of stages comprises a first stage, a second stage, a third stage, and a fourth stage arranged in a sequential series loop, wherein the first and third stages are coupled to a first clock transformer and the second and fourth stages are coupled to a second clock transformer, wherein the first clock transformer comprises a primary inductor configured to propagate the in-phase component of the AC clock signal and the second clock transformer comprises a primary inductor configured to propagate the quadrature-phase component of the AC clock signal.

9. The system of claim 8, wherein, during activation of the flux-shuttle loop, the first stage is configured to propagate a single flux quantum (SFQ) pulse to the second stage based on the triggering of the respective at least one Josephson junction in response to a first phase of the in-phase component of the AC clock signal, the second stage is configured to propagate the SFQ pulse to the third stage based on the triggering of the respective at least one Josephson junction in response to a first phase of the quadrature-phase component of the AC clock signal, the third stage is configured to propagate the SFQ pulse to the fourth stage based on the triggering of the respective at least one Josephson junction in response to a second phase of the in-phase component of the AC clock signal that is opposite the first phase, and the fourth stage is configured to propagate the SFQ pulse to the first stage based on the triggering of the respective at least one Josephson junction in response to a second phase of the quadrature-phase component of the AC clock signal opposite the first phase.

10. The system of claim 9, wherein the first clock transformer comprises a secondary inductor that is arranged in a first loop with the first stage and the third stage, and wherein the second clock transformer comprises a secondary inductor that is arranged in a second loop with the second stage and the fourth stage, the system further comprising:
    an output inductor configured to provide the DC output current;
    a first storage inductor interconnecting the output inductor and the first loop to provide a voltage pulse to the output inductor as the SFQ pulse propagates through each the first and third stages; and
    a second storage inductor interconnecting the output inductor and the second loop to provide a voltage pulse to the output inductor as the SFQ pulse propagates through each the second and fourth stages.

11. A method for generating a DC output current, the method comprising:
    providing an AC clock signal through a primary inductor of a clock transformer, the clock transformer comprising a secondary inductor arranged in a loop with at least two of a plurality of stages of a flux-shuttle loop, the plurality of stages being arranged in a series sequential loop; and
    providing a DC injection signal to a flux injector system to generate a single flux quantum (SFQ) pulse at one of the plurality of stages, the SFQ pulse being propagated through the plurality of stages to generate voltage pulses in an output inductor to generate the DC output current based on a sequential triggering of a Josephson junction in each of the plurality of stages, the flux injector system being configured to automatically deactivate and reactivate the flux-shuttle loop based on an amplitude of the DC output current relative to an amplitude of the DC injection signal.

12. The method of claim 11, further comprising setting an amplitude of the DC injection signal to set at least one of an activation threshold and a deactivation threshold associated with the amplitude of the DC output current for the automatic reactivation and deactivation, respectively, of the flux-shuttle loop.

13. The method of claim 11, wherein the flux-shuttle loop further comprises:
    a plurality of storage inductors that are each coupled to at least one of the plurality of stages and are each configured to receive a voltage pulse associated with the sequential triggering of the Josephson junction in each of the plurality of stages; and an output inductor coupled to each of the plurality of storage inductors and being configured to provide the DC output current in response to the voltage pulse provided via each of the plurality of storage inductors.

14. The method of claim 11, wherein providing the DC injection signal comprises providing the DC injection signal to a primary inductor of an injection transformer that is inductively coupled to the flux injector system, the injection transformer being configured to induce an injection current based on the DC injection signal to inject the SFQ pulse into the flux-shuttle loop in response to the DC output current being less than or equal to a predetermined activation threshold and to inject a negative SFQ pulse in response to the DC output current being greater than a predetermined deactivation threshold.

15. The method of claim 14, wherein the flux injector system further comprises a feedback transformer that is inductively coupled to the flux injector system, the feedback transformer being configured to induce a feedback current based on the DC output current, wherein the feedback current has a current direction that is opposite the injection current to automatically deactivate and reactivate the flux-shuttle loop based on the amplitude of the feedback current relative to the amplitude of the injection current.

16. The method of claim 11, wherein the plurality of stages comprises a first stage, a second stage, a third stage, and a fourth stage arranged in a sequential series loop, and wherein providing the AC clock signal comprises providing each of an in-phase component and a quadrature-phase component of the AC clock signal, the in-phase and quadrature phase components being out-of-phase by approximately 90°, to propagate the SFQ pulse through each respective one of the first, second, third, and fourth stages at each quarter period of the AC clock signal.

17. A Josephson current source system comprising:
a flux-shuttle loop comprising a first stage, a second stage, a third stage, and a fourth stage arranged in a series loop, each of the first, second, third, and fourth stages comprising at least one Josephson junction, the flux-shuttle loop being configured, when activated, to sequentially trigger the at least one Josephson junction in each of the first, second, third, and fourth stages about the flux-shuttle loop in response to an inductively-coupled AC clock signal comprising an in-phase component and a quadrature-phase component that are out-of-phase by approximately 90°;

a first storage inductor that is associated with the first and third stages and is configured to receive a voltage pulse associated with the sequential triggering of the at least one Josephson junction in each of the first and third stages;

a second storage inductor that is associated with the second and fourth stages and is configured to receive a voltage pulse associated with the sequential triggering of the Josephson junction in each of the second and fourth stages;

an output inductor coupled to each of the first and second storage inductors and being configured to provide a DC output current in response to the voltage pulse provided via each of the first and second storage inductors; and a flux injector system that is configured to activate the flux-shuttle loop, and is further configured to automatically deactivate and reactivate the flux-shuttle loop based on an amplitude of the DC output current.

18. The system of claim 17, wherein the flux injector system comprises an injection transformer that is inductively coupled to the flux injector system, the injection transformer being configured to induce an injection current based on a DC injection signal to inject a single-flux quantum (SFQ) pulse in response to the DC output current being less than or equal to a predetermined activation threshold and to inject a negative SFQ pulse in response to the DC output current being greater than a predetermined deactivation threshold.

19. The system of claim 18, wherein the flux injector system forms a portion of one of the plurality of stages, wherein the DC injection signal has a predetermined amplitude that defines both the predetermined activation threshold and a predetermined deactivation threshold based on a flux of the respective one of the plurality of stages.

20. The system of claim 18, wherein the flux injector system further comprises a feedback transformer that is inductively coupled to the flux injector system, the feedback transformer being configured to induce a feedback current based on the DC output current, wherein the feedback current has a current direction that is opposite the injection current to automatically deactivate and reactivate the flux-shuttle loop based on the amplitude of the feedback current relative to the amplitude of the injection current.

* * * * *